(12) United States Patent
Dubey (10) Patent No.: US 7,215,152 B2
(45) Date of Patent: May 8, 2007

(54) HIGH PERFORMANCE ADAPTIVE LOAD OUTPUT BUFFER WITH FAST SWITCHING OF CAPACITIVE LOADS

(75) Inventor: Hari Bilash Dubey, Dt-Ghazipur (IN)

(73) Assignee: STMicroelectronics PVT Ltd., Uttar Pradesh (IN)

(*) Notice: Subject to any disclaimer, the term of this patent is extended or adjusted under 35 U.S.C. 154(b) by 54 days.

(21) Appl. No.: 11/205,482

(22) Filed: Aug. 17, 2005

(65) Prior Publication Data
US 2006/0049848 A1    Mar. 9, 2006

(30) Foreign Application Priority Data
Aug. 17, 2004    (IN) .................. 1531/DEL/2004

(51) Int. Cl.
*H03K 19/0175*    (2006.01)
(52) U.S. Cl. .................. 326/83; 326/27; 326/87
(58) Field of Classification Search .......... 326/26, 326/27, 81–87
See application file for complete search history.

(56) References Cited
U.S. PATENT DOCUMENTS

| | | | |
|---|---|---|---|
| 4,992,676 A * | 2/1991 | Gerosa et al. ............ | 326/27 |
| 6,909,306 B2 * | 6/2005 | El-Ayat .................. | 326/38 |
| 6,924,669 B2 * | 8/2005 | Itoh et al. ............... | 326/87 |
| 7,126,389 B1 * | 10/2006 | McRae et al. ........... | 327/112 |
| 7,161,376 B2 * | 1/2007 | Gallo et al. ............. | 326/27 |

* cited by examiner

*Primary Examiner*—Don Le
(74) *Attorney, Agent, or Firm*—Lisa K. Jorgenson; Allen, Dyer, Doppelt, Milbrath & Gilchrist, P.A.

(57) ABSTRACT

A high performance adaptive load output buffer with fast switching of capacitive loads includes a first set of series connected complementary cascode structures having a first output node at the junction of the cascode connected p-channel device, a second output node at the junction of the two cascode structures, and a third output node at the junction of the cascode connected n-channel device. The buffer also may include at least one second set of series connected complementary cascode structures having the control terminal of the p-channel cascode structure of the second set connected to the inverted output from the first output node of first complementary cascode structure. The control terminal of the n-channel cascode structure of the second set may be connected to the inverted output from the third output node of first complementary cascode structure. The common terminal of the second cascode structure may be connected to the second output node of first complementary cascode structure and the output pad.

12 Claims, 7 Drawing Sheets

HIGH PERFORMANCE ADAPTIVE LOAD OUTPUT BUFFER WITH FAST SWITCHING OF CAPACITIVE LOADS

FIELD OF THE INVENTION

The present invention relates to a high performance adaptive load output buffer with fast switching of capacitive loads.

BACKGROUND OF THE INVENTION

An off-chip pad driver is primarily used to provide data at the output pad that transmits data to a receiver contained in another chip which may be located at quite a distance. The receiver is triggered by this data, hence, it may be required that it receives a good signal in terms of amplitude, frequency and noise level at its input. To transmit data at high-speed, it may be essential to maintain a noise immunity level in conjunction with the rise and fall slew rates of the driver being appreciably high. In some cases, the driver may be used in different environment where the capacitive load, driven by the pad driver, varies to a large extent.

Figure 1:
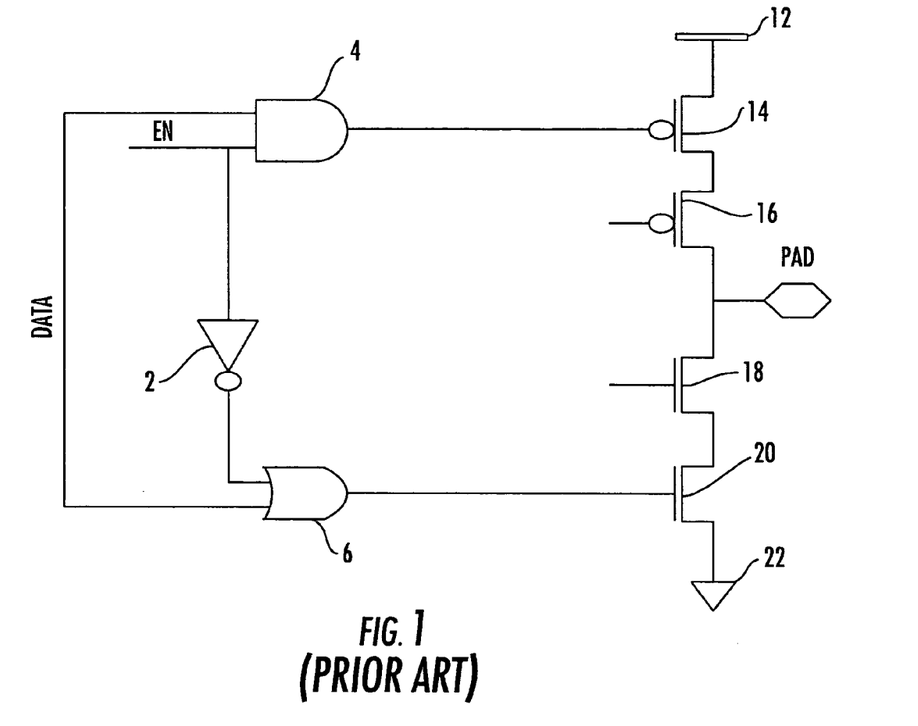
FIG. 1 is the schematic diagram of a prior art circuit.

FIG. 1 shows the prior art pad driver circuit. EN is the tri-state signal connected to one of the inputs of NAND gate 4 while the other input of the gate 4 is a data signal (DATA). The EN signal is also connected to the input of the inverter 2, the output of which is connected to the input of NOR gate 6. The DATA signal acts as second input of the NOR gate 6. The core provides both the signals. The pull-up section of the driver contains P-channel transistors 14 and 16 whereas the pull-down section of the driver contains N-channel devices 18 and 20. Transistors 16 and 18 are provided for specific purposes like providing process compensation etc.

A high logic level at the EN signal enables the driver and passes the data. When the data switches from a low logic level to a high logic level, the pull-up transistors switch at a slower rate than the pull-down transistors. The pad achieves the high logic level. When the data switches from a high level to a low level, the pull-down transistors transit at a slower rate than the pull-up transistors, thereby making the pad achieve the low logic level. This mechanism helps to remove the crowbar current though the driver.

The performance of the driver may be very good for a given load, but its use may be limited to a particular application. Also if the driver is made small considering minimum load conditions, it may become useless for high load applications at the given speed, whereas if it is made larger to provide higher drive, the noise level at lower load environments is high thus degrading driver performance.

Figure 2:
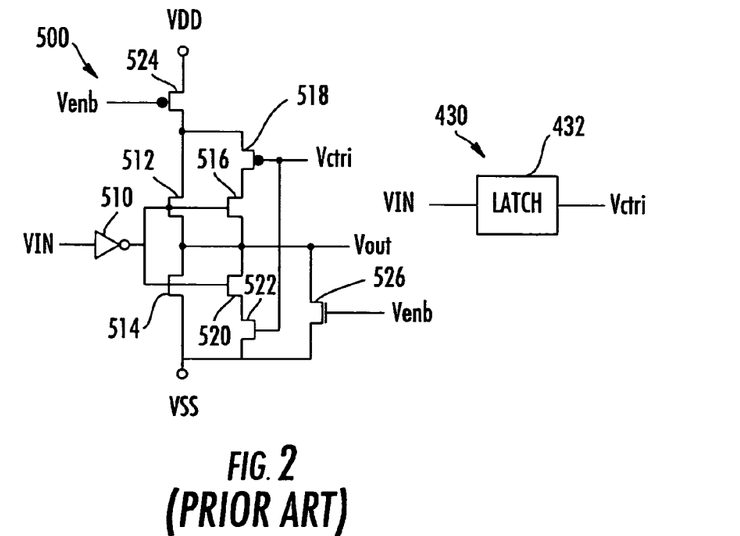
FIG. 2 is the schematic diagram of another prior art circuit.

Another prior art circuit is presented in U.S. Pat. No. 6,597,199 with the title "Method and circuit for logic output buffer" as shown in FIG. 2. It provides the benefit of faster switching, low switching noise and improved switching time, but it does not depict dynamic control on the voltage slew rate control with respect to capacitance variation at the pad. Further details can be referred to from the patent.

Figure 3:
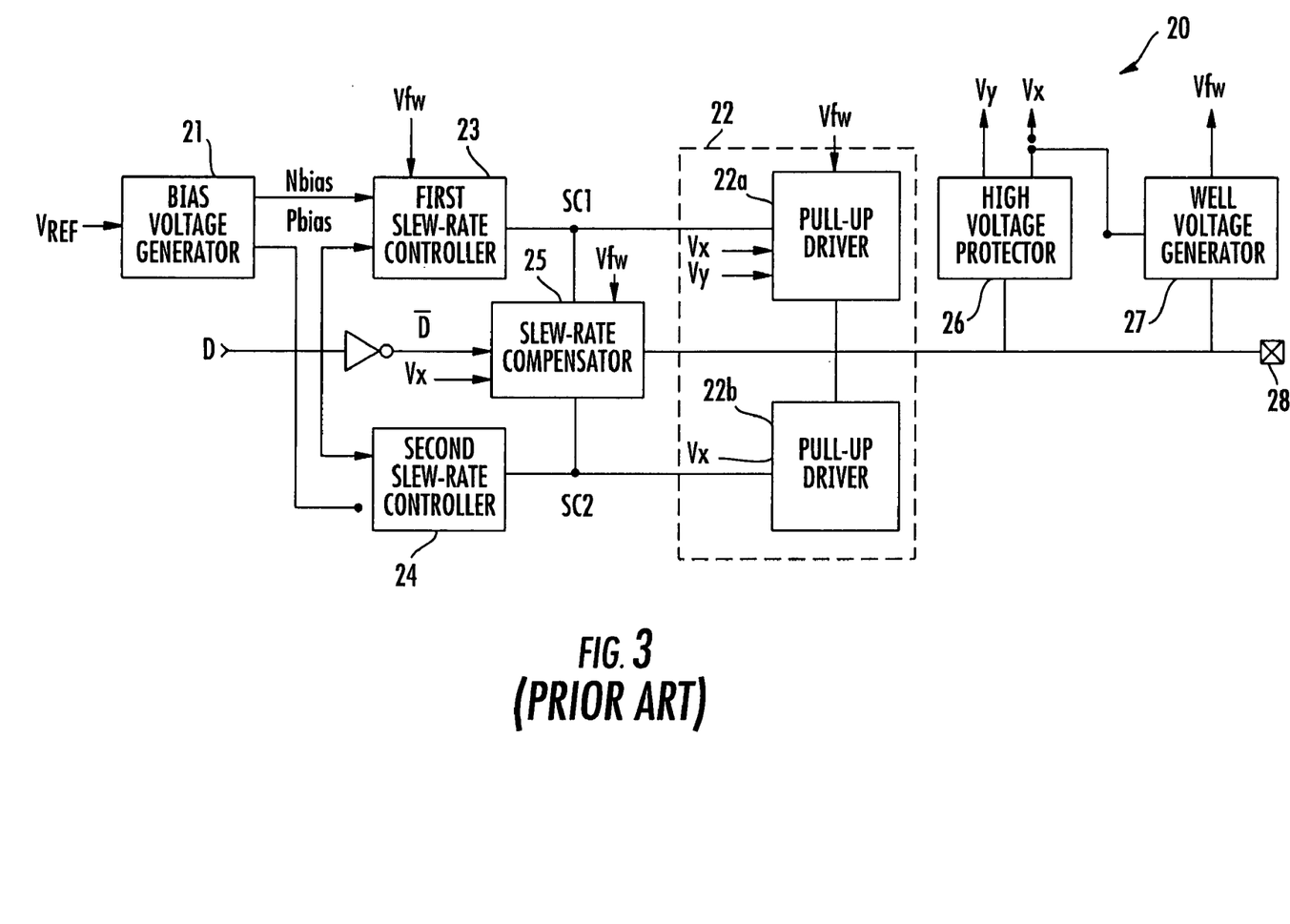
FIG. 3 is the schematic diagram of yet another prior art circuit.

Yet another prior art circuit is presented in FIG. 3 of U.S. Pat. No. 6,583,644 titled "Output buffer for reducing slew rate variation". It uses a slew rate compensator for minimizing slew rate variation caused by the change in the load capacitance at the pad terminal. It compensates for the slew rate through coupling of the pad voltage with the driving stage. However the circuit has following disadvantages.

Reduced slew rate variation is achieved though capacitive coupling of the complementary signal ultimately slowing the signal at the pad. Therefore, the size of the driver and the pre-driver circuit increases for a given drive. It also increases the power dissipation of the circuit.

For high-speed design, when signal switching is fast, capacitive coupling may not be effective. The circuit, therefore, does not take care of the capacitance variation at the pad.

SUMMARY OF THE INVENTION

Therefore it is an object to provide a circuit which takes care of the shortcomings of the aforementioned approaches and takes care of load variation at the pad for low as well as high speed design by providing a driver, which can be used in different environments. The circuit senses the need for higher or lower drive and thereby provides a high drive in accordance with the load variation by using a feedforward circuit.

Another object of the invention is to provide a feedforward circuit for accurate adjustment of the drive against the load.

Yet another object of the invention is to provide a feedforward circuit, which compensates for the drive at a higher load simultaneously keeping the crowbar current at a minimum, thereby keeping the switching noise at a minimum.

To achieve these and other objects, the high performance adaptive load output buffer may comprise a first set of series connected complementary cascode structures having a first output node at the junction of the cascode connected p-channel device, a second output node at the junction of the two cascode structures, and a third output node at the junction of the cascode connected n-channel device. The buffer may also include at least one second set of series connected complementary cascode structures having the control terminal of the p-channel cascode structure of the second set connected to the inverted output from the first output node of first complementary cascode structure, the control terminal of the n-channel cascode structure of the second set connected to the inverted output from the third output node of first complementary cascode structure, and the common terminal of the second cascode structure connected to the second output node of first complementary cascode structure and the output pad.

In accordance with another embodiment, the high performance adaptive load output buffer with fast switching of capacitive loads may comprise a first set of series connected complementary cascode structures having a first output node at the junction of the cascode connected p-channel device, a second output node at the junction of the two cascode structures, and a third output node at the junction of the cascode connected n-channel device. This embodiment of the buffer may also include second sets of series connected complementary cascode structures having the control terminal of the p-channel cascode structure of the second sets connected to the inverted output from the first output node for first complementary cascode structure with the control terminal of the p-channel cascode structure of the subsequent set of the second sets being provided staggered inputs through the inverters from the preceding set of the second set. The control terminal of the n-channel cascode structure of the second sets may be connected to the inverted output from the third output node for first complementary cascode structure with the control terminal of the n-channel cascode structure of the subsequent set of the second sets being provided staggered inputs through the inverters from the preceding set of the second sets. In addition, the common terminal of the second cascode structure may be connected to the second output node with the control terminal of subsequent set of the second sets being connected to the preceding nodes and the last set of the second sets may be connected to the output pad.

The devices between the first and second nodes and the second and third nodes may be replaced by transmission gates so as to speed up the charging/discharging of inverted node capacitance and reduce power dissipation. Additional gates may be provided with the subsequent second set of series connected complementary cascode structures for providing fast turning on/off of the p-channel and n-channel cascode structures thereby lowering low crowbar current.

The buffer may include two or more second sets of series connected complementary cascode structures to provide switching at discrete time intervals thereby providing better load insensitivity simultaneously keeping the crowbar current minimum.

The present invention also provides a method for providing a high performance adaptive load output buffer with fast switching of capacitive loads. The method may include charging/discharging first/third node of the first set of series connected complementary cascode structures having low capacitance, and charging/discharging the output pad connected to the last set of at least one second set of series connected complementary cascode structures using the first/third node, thereby speeding up the charging/discharging of the output pad and reducing power dissipation.

BRIEF DESCRIPTION OF THE DRAWINGS

The invention will now be described with reference to the accompanying drawings

DETAILED DESCRIPTION OF THE PREFERRED EMBODIMENTS

Figure 4:
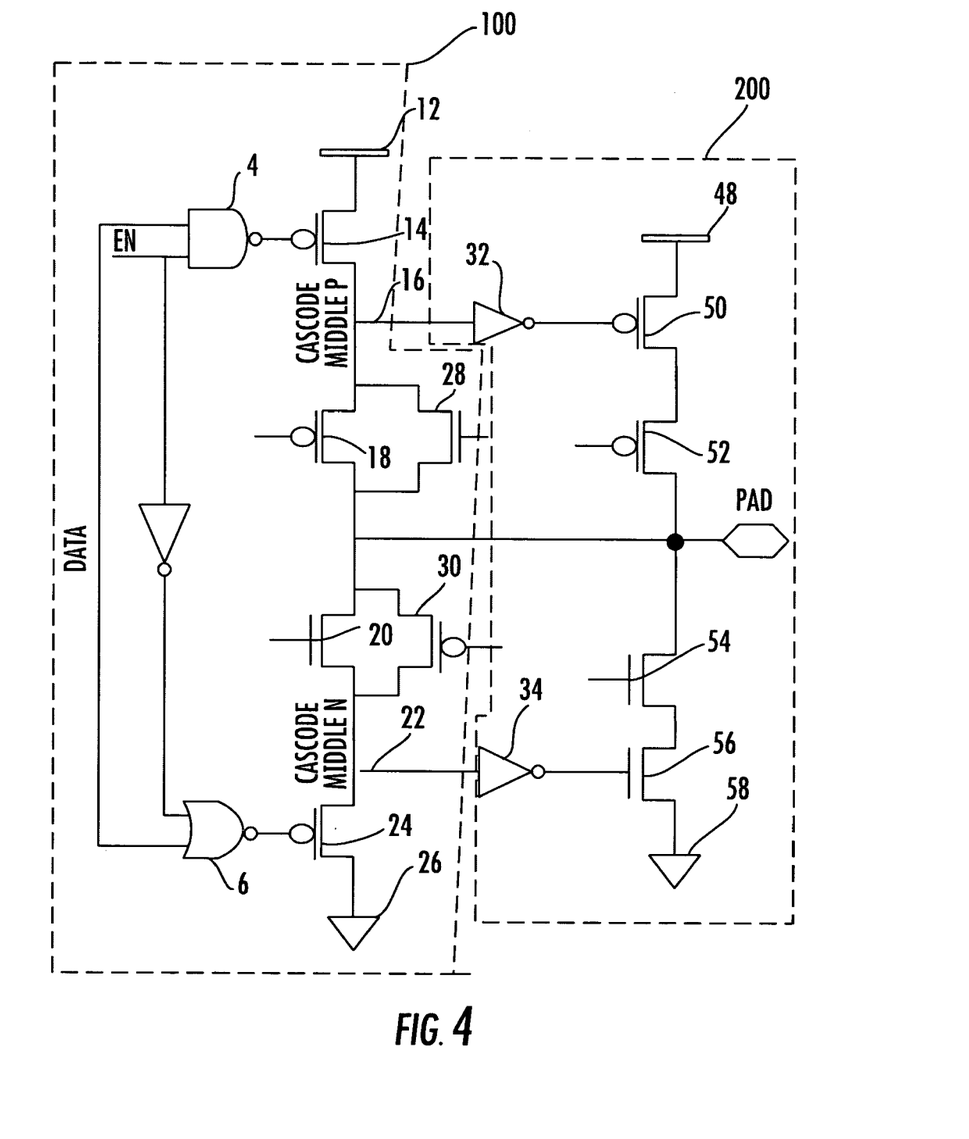
FIG. 4 shows the schematic diagram of the circuit in accordance with the first embodiment of the present invention.

FIG. 4 shows the circuit in accordance with the first embodiment of the present invention. It includes a driver circuit 100 and the feedforward circuit 200. The working of the driver circuit 100 is very similar to that of the prior art circuit. The feedforward circuit 200 includes an inverter 32, pull-up p-channel transistors 50 and 52, another inverter 34 and pull-down N-channel transistors 54 and 56. The input to the inverter 32 is provided by CASCODE MIDDLE P node 16 and its output is connected to the gate of a P-channel transistor 50. Similarly, the input to the inverter 34 is provided by CASCODE MIDDLE N node 22 and its output is connected to the gate of an N-channel transistor 56. The transistors 18, 20, 28 and 30 of the driver along with the transistors 52 and 54 are normally kept on. It can be appreciated by those of ordinary skill in the art that the transistors 28 and 30 can be removed from the circuit, but it will result in power dissipation through the sensing inverters 32 and 34 as the transistors 28 and 30 keep the crowbar current minimum when a weak '1' or weak '0' is provided by the transistors 14 and 24 respectively.

First, take the case of logic 0 to logic 1 transition. When the input DATA is at logic 0, the transistor 14 is off while the nodes 16, 22 and the output PAD are at logic 0. Thus, the transistor 56 is on while the transistor 50 is off. Now, if the input makes a transition from logic 0 to logic 1, the output PAD and the nodes 16 and 22 start charging. Since the node 16 has lower capacitance than the output PAD, so charging of this node is faster. Because of the lower capacitance offered by the node 16, the output PAD gets charged faster via node 16, inverter 32 and transistors 50 and 52. Once the output PAD has achieved a high logic level, the feedforward circuit does not play any role.

Also as the capacitance of the output PAD increases, the signal rise at the output PAD becomes slower whereas the rise of the node 16 remains higher. This slower output PAD makes the drain to source voltage of the transistor 50 higher. Thus, the transistor pulls-up the pad node faster thereby, providing higher drive for pull-up. The higher the capacitance at the output PAD, the more effective the feedforward circuit is. The trip-point of the inverter 32 is set lower than half of the rail voltage so that feedforward circuit is more effective.

Similarly, take the case of logic 1 to logic 0 transition. When the input DATA is at logic 1, the transistor 24 is off while the nodes 16, 22 and the output PAD are at logic 1. Thus, the transistor 56 is off while the transistor 50 is on. Now, if the input makes a transition from logic 1 to logic 0, the output PAD and the nodes 22 and 16 start discharging. Since node 22 has lower capacitance than the output PAD, discharging of this node is faster. Because of the lower capacitance offered by the node 22, the output PAD gets discharged faster via transistors 54 and 56, inverter 34, node 22 and transistor 24. Once the output PAD has achieved a low logic level, the feedforward circuit does not play any role.

As the capacitance of the output PAD increases, the fall of signal at the output PAD becomes slower whereas the fall at the node 22 remains higher. Since the output PAD is slower the drain to source voltage of the transistor 56 is higher. Thus, the transistor pulls-down the pad node faster thereby, providing higher drive for the pull-down. The higher the capacitance at the output PAD, the more effective the feedforward circuit is. The trip-point of the inverter 34 is set more than half of the rail voltage so that feedforward circuit is more effective.

Figure 5:
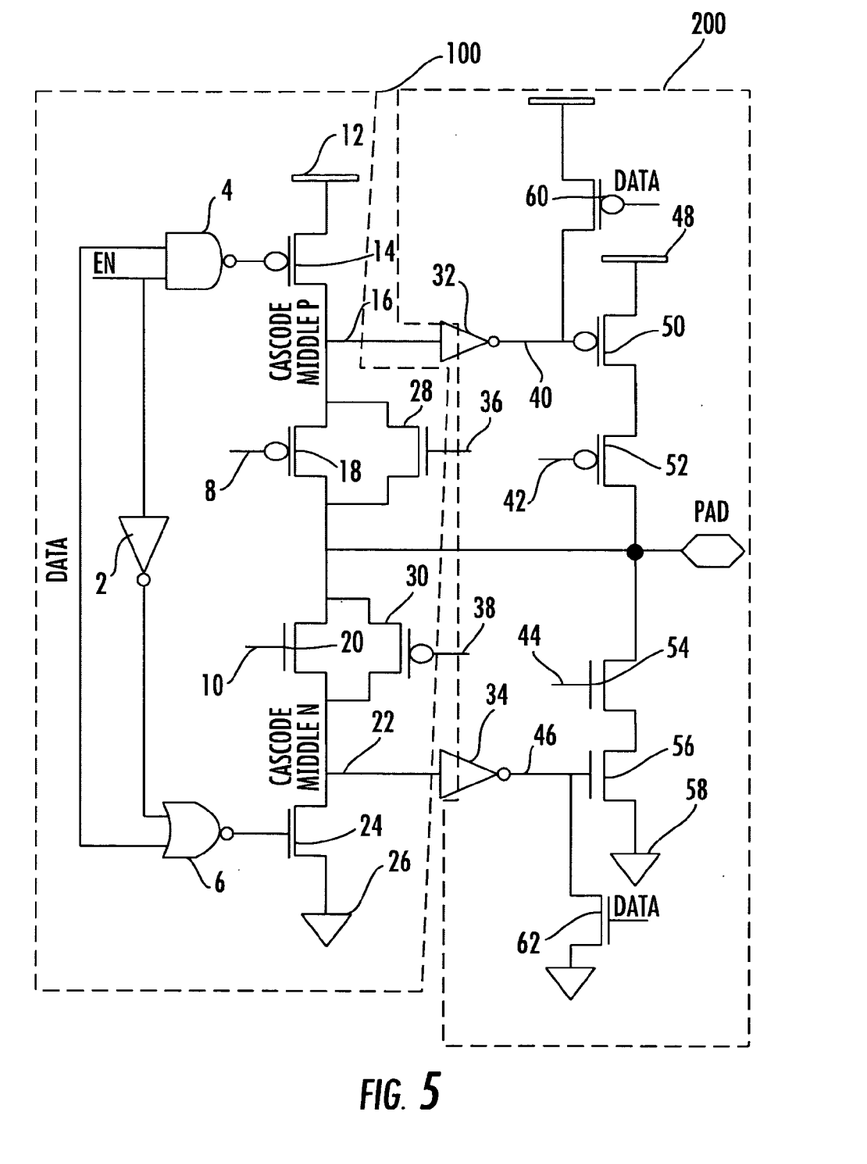
FIG. 5 shows the schematic diagram of the circuit in accordance with the second embodiment of the present invention.

FIG. 5 shows the circuit in accordance with the second embodiment of the present invention. In this embodiment, transistors 60 and 62 are added to provide faster turn on/off of transistors 50 and 56 so that crowbar current is minimized. As they are controlled by the data itself, turn on/off of the transistors 60 and 62 is fast. So they do not hamper the normal operation of the sensing inverter. Therefore transistors 60 and 62 act like switches, which provide faster turn off of the devices 50 and 56 to minimize the crowbar current.

Figure 6:
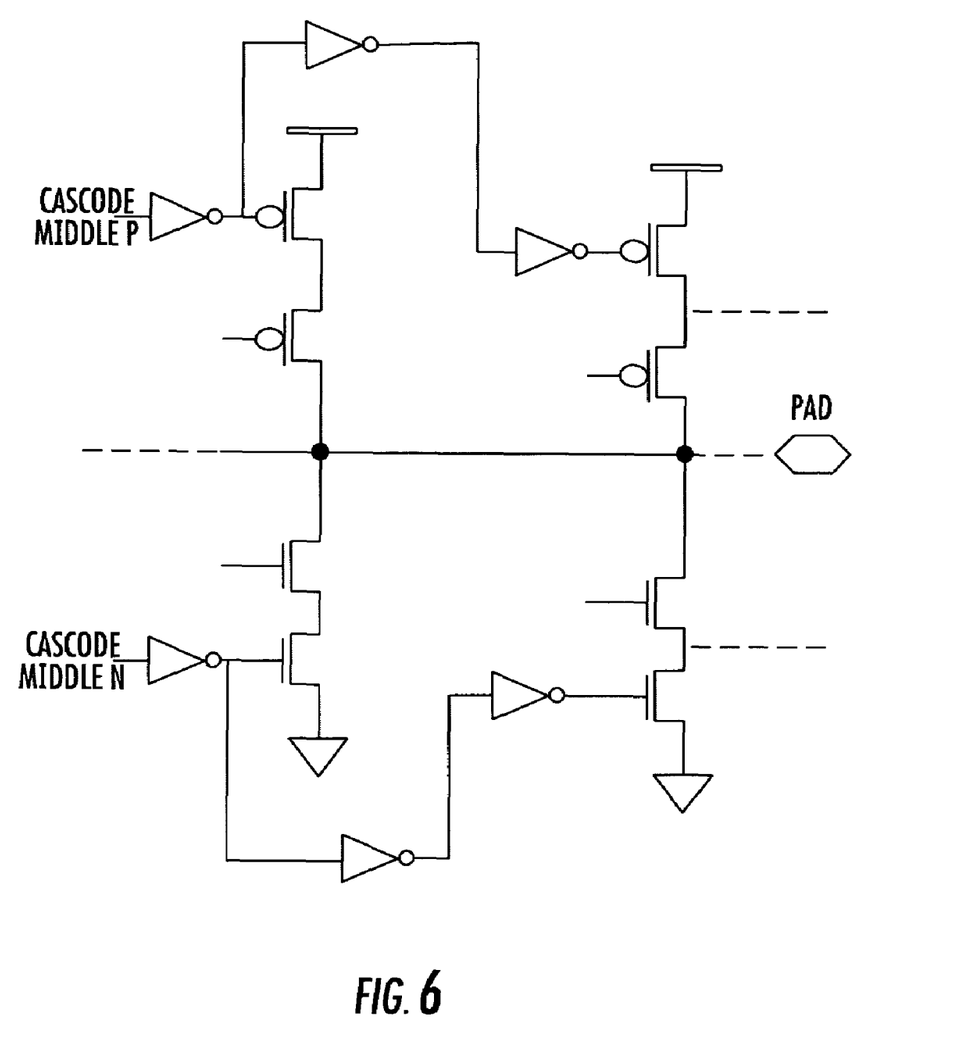
FIG. 6 shows the schematic diagram in accordance with the third embodiment of the present invention.

FIG. 6 shows the circuit in accordance with third embodiment. In this embodiment, feedforwards are provided at different times for the signal transition at the output PAD for high load. This step switching mechanism provides low noise and high-speed output. The feedforward circuit contains odd numbered sensing inverters each of them their own driver for compensating the drive against load. In heavy load applications, these feedforward circuits turn on the drivers at different times during transition depending upon the delay provided to the sensing inverters to provide higher drive. This helps the driver achieve better drive characteristics against the load. It can be appreciated by those of ordinary skill in the art that a method similar to second embodiment can be used to minimize crowbar current in this case also.

Simulation Results

Figure 7:
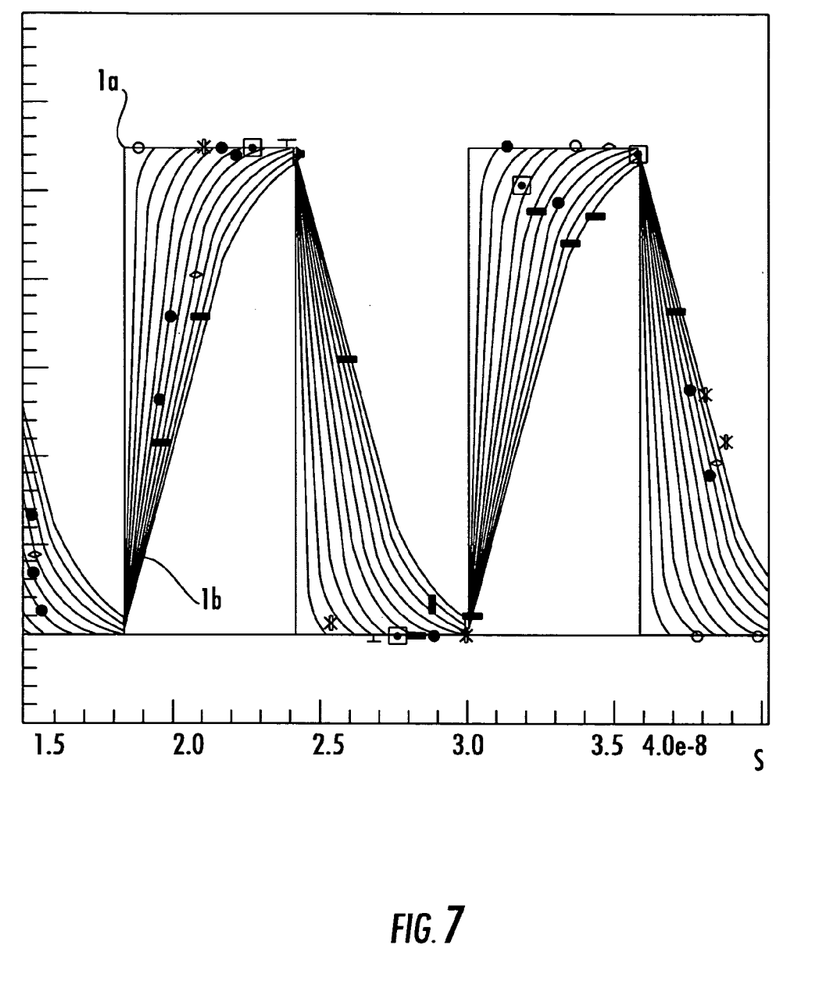
FIGS. 7 & 8 each show the simulation results of the circuit of the present invention versus the prior art.

FIG. 7 shows the simulation result of the circuit of the present invention versus prior art. Wave 1a is the input waveform while wave 1b is the waveform according to the prior art circuit. Simulations were performed at 86.67 MHz with varying load of 5 pF to 50 pF in ST CMOS090 technology.

Figure 8:
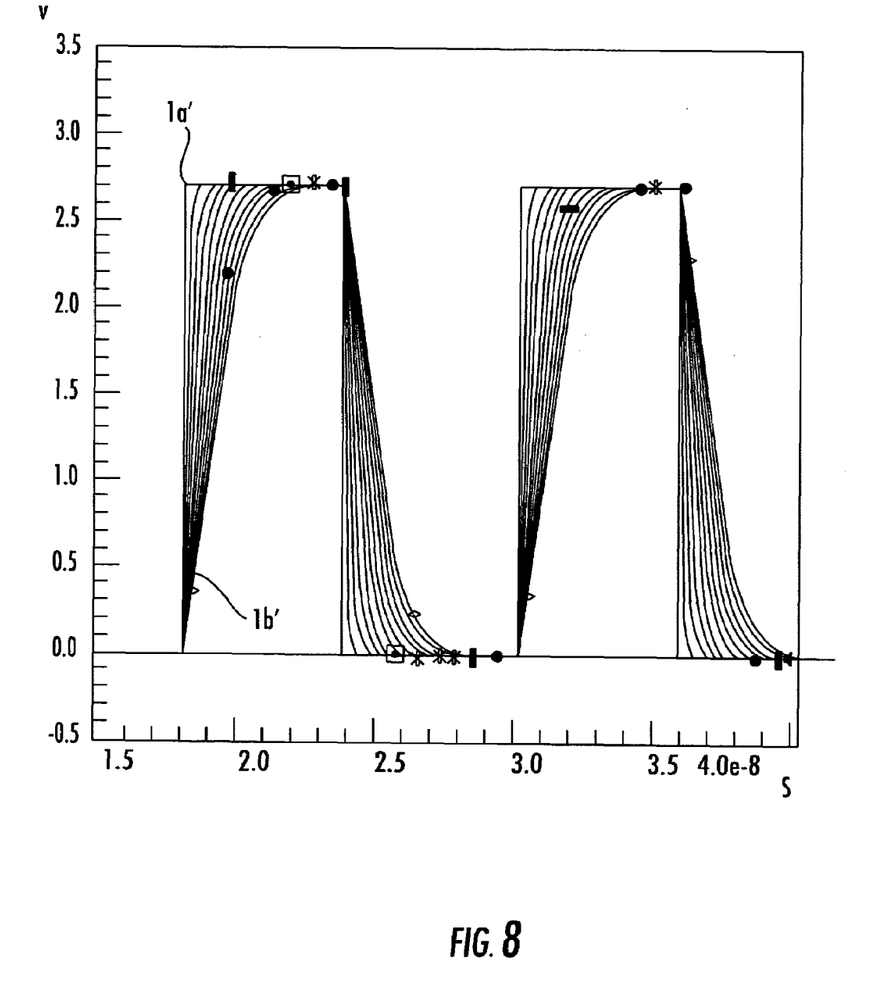

FIG. 8 shows another the simulation result of the circuit of the present invention versus prior art. Wave 1a' is the input waveform while wave 1b' is the waveform according to the first embodiment of the present invention, which denotes step switching. As can be seen from the waveforms they are steeper than the prior art thereby showing fast charging or discharging mechanism.

It can also be appreciated by those of ordinary skill in the art that many modifications of the circuit are possible with the same concept without departing from the spirit of the present invention.

The invention claimed is:

1. An adaptive load output buffer comprising:
   a first set of series connected complementary cascode structures comprising respective p-channel and n-channel devices and having
      a first output node at a junction between the p-channel devices,
      a second output node at a junction between the complementary cascode structures, and
      a third output node at a junction between the n-channel devices; an output pad; first and second inverters; and
   at least one second set of series connected complementary cascode structures comprising a p-channel cascode structure and n-channel cascode structure and having
      a control terminal of the p-channel cascode structure connected to the first output node via said first inverter,
      a control terminal of the n-channel cascode structure connected to the third output node via the second inverter, and
      a common terminal between said p-channel and n-channel cascode structures connected to the second output node and said output pad.

2. The adaptive load output buffer according to claim 1 wherein said first set of series connected complementary cascode structures function as respective transmission gates between the first and second nodes and the second and third nodes to speed charging/discharging of said output node and reduce power dissipation.

3. The adaptive load output buffer according to claim 1 wherein said at least one second set of series connected complementary cascode structures further comprises respective devices cooperating with said p-channel and n-channel cascode structures to speed turning on/off thereof thereby lowering crowbar current.

4. The adaptive load output buffer according to claim 1 wherein said at least one second set of series connected complementary cascode structures comprises a plurality thereof to provide switching at discrete time intervals.

5. An adaptive load output buffer comprising:
   a first set of series connected complementary cascode structures comprising respective p-channel and n-channel devices and having
      a first output node at a junction between the pchannel devices,
      a second output node at a junction between the complementary cascode structures, and
      a third output node at a junction between the n-channel devices;
   an output pad;
   a first inverter and a second inverter; and
   a plurality of second sets of series connected complementary cascade structures each comprising a p-channel cascade structure and n-channel cascade structure and having
      a control terminal of the p-channel cascade structure of an initial second set connected to the first output node via said first inverter with a control terminal of the p-channel cascade structure of a subsequent second set being provided a staggered input from the first inverter;
      a control terminal of the n-channel cascade structure of the initial second set connected to the third output node via the second inverter with a control terminal of the n-channel cascade structure of the subsequent second set being provided a staggered input from the second inverter; and
      each node between respective p-channel and n-channel cascade structures for the second sets connected together, to the second output node and to said output pad.

6. The adaptive load output buffer according to claim 5 wherein said first set of series connected complementary cascode structures function as respective transmission gates between the first and second nodes and the second and third nodes to speed charging/discharging of said output node and reduce power dissipation.

7. The adaptive load output buffer according to claim 5 wherein at least one of said second sets further comprises respective devices cooperating with said p-channel and n-channel cascode structures to speed turning on/off thereof thereby lowering crowbar current.

8. The adaptive load output buffer according to claim 5 wherein said second sets provide switching at discrete time intervals.

9. A method for operating an adaptive load output buffer comprising a first set of series connected complementary cascode structures comprising respective p-channel and n-channel devices and having a first output node at a junction between the p-channel devices, a second output node at a junction between the complementary cascode structures, and a third output node at a junction between the nchannel devices; and at least one second set of series connected complementary cascode structures comprising a p-channel cascode structure and n-channel cascode structure and having a control terminal of the p-channel cascode structure connected to the first output node via a first inverter, a control terminal of the n-channel cascode structure connected to the third output node via a second inverter, and a common terminal between said p-channel and nchannel cascode structures connected to the second output node and an output pad; the method comprising:
   charging/discharging the first/third node of the first set of series connected complementary cascode structures; and charging/discharging the output pad using the first/third node.

10. The method according to claim 9 wherein said first set of series connected complementary cascode structures function as respective transmission gates between the first and second nodes and the second and third nodes to speed charging/discharging of said output node and reduce power dissipation.

11. The method according to claim 9 wherein said at least one second set of series connected complementary cascode structures further comprises respective devices cooperating with said p-channel and n-channel cascode structures to speed turning on/off thereof thereby lowering crowbar current.

12. The method according to claim 9 wherein said at least one second set of series connected complementary cascode structures comprises a plurality thereof to provide switching at discrete time intervals.

* * * * *

UNITED STATES PATENT AND TRADEMARK OFFICE
CERTIFICATE OF CORRECTION

PATENT NO. : 7,215,152 B2 Page 1 of 1
APPLICATION NO. : 11/205482
DATED : May 8, 2007
INVENTOR(S) : Dubey It is certified that error appears in the above-identified patent and that said Letters Patent is hereby corrected as shown below:

| | |
|---|---|
| Column 1, Line 22 | Delete: "environment"<br>Insert: -- environments -- |
| Column 1, Line 64 | Delete: "has following"<br>Insert: -- has the following -- |
| Column 4, Line 10 | Delete: " so " |
| Column 4, Line 54 | Delete: " . So "<br>Insert: -- , so -- |
| Column 6, Line 5 | Delete: " pchannel "<br>Insert: -- p-channel -- |
| Column 6, Lines 14, 15, 17, 20, 23, 26 and 30 | Delete: " cascade "<br>Insert: -- cascode -- |
| Column 6, Lines 55 and 62-63 | Delete: " nchannel "<br>Insert: -- n-channel -- |

Signed and Sealed this

Fourteenth Day of August, 2007

JON W. DUDAS
*Director of the United States Patent and Trademark Office*